(12) United States Patent
Morozumi et al.

(10) Patent No.: US 8,277,891 B2
(45) Date of Patent: Oct. 2, 2012

(54) METHOD FOR SUPPRESSING PARTICLE GENERATION DURING SEMICONDUCTOR MANUFACTURING

(75) Inventors: Yuichiro Morozumi, Nirasaki (JP); Kenichi Koyanagi, Tokyo-to (JP); Takashi Arao, Tokyo-to (JP); Kazunori Une, Tokyo-to (JP)

(73) Assignee: Tokyo Electron Limited, Tokyo (JP)

( * ) Notice: Subject to any disclaimer, the term of this patent is extended or adjusted under 35 U.S.C. 154(b) by 118 days.

(21) Appl. No.: 12/766,319

(22) Filed: Apr. 23, 2010

(65) Prior Publication Data
US 2010/0203741 A1 Aug. 12, 2010

Related U.S. Application Data

(63) Continuation of application No. 11/802,358, filed on May 22, 2007, now abandoned.

(30) Foreign Application Priority Data

May 23, 2006 (JP) ................................. 2006-142626

(51) Int. Cl.
*C23C 16/30* (2006.01)
(52) U.S. Cl. .......... 427/255.23; 427/255.28; 427/255.31
(58) Field of Classification Search ............. 427/255.23, 427/255.28, 255.29, 255.31; 117/84, 106
See application file for complete search history.

(56) References Cited

U.S. PATENT DOCUMENTS

| | | | |
|---|---|---|---|
| 2005/0008779 A1* | 1/2005 | Yang et al. ................. | 427/248.1 |
| 2005/0158590 A1* | 7/2005 | Li ................................. | 428/698 |
| 2005/0196535 A1 | 9/2005 | Weigel et al. | |
| 2005/0284370 A1* | 12/2005 | Strang ........................... | 118/715 |
| 2005/0287806 A1* | 12/2005 | Matsuura ....................... | 438/680 |
| 2007/0051310 A1* | 3/2007 | Koyanagi ...................... | 118/715 |
| 2007/0235321 A1* | 10/2007 | Cerio, Jr. .................. | 204/192.15 |

FOREIGN PATENT DOCUMENTS

| | | | |
|---|---|---|---|
| JP | 9-97766 | * | 4/1997 |
| JP | 09097766 A | | 4/1997 |
| KR | 2006-43323 | | 5/2006 |

OTHER PUBLICATIONS

Lim, Jongmin, et al., "Effects of substrate temperature on the microstructure and photoluminescence properties of ZnO thin films prepared by atomic layer deposition". Thin Solid Films 515 (2007) pp. 3335-3338.*
Machine translation of JP 09-097766.*
Chinese Office Action mailed on Mar. 25, 2010 for Chinese Application No. 200710104875.6 w/ English translation. Machine Translation, Jan. 18, 2010, Japanese Patent Office, pp. 1-4.
Chinese Office Action issued on Oct. 26, 2010 for KR Application No. 200710104875.6 w/ English translation.
Korean Office Action issued on May 27, 2011 for Application No. 2007-49658 w/ English language translation.

* cited by examiner

*Primary Examiner* — Bret Chen
(74) *Attorney, Agent, or Firm* — Smith, Gambrell & Russell, LLP

(57) ABSTRACT

A technique for effectively suppressing the generation of particles resulting from peeling-off of unnecessary films that have unavoidably adhered to the inner surface of the reaction tube of an ALD film-forming apparatus during a film formation process for forming a film on a semiconductor substrate. A precoating process utilizing ALD is performed to deposit a metal oxide film, e.g., an aluminum oxide film, onto the unnecessary films, in order to prevent peeling-off of the unnecessary films. Ozone is supplied, as a precoat gas, into the reaction tube during the precoating process by a nozzle of a different type and/or position from that of the nozzle for supplying ozone, as a film-forming gas, into the reaction tube during the film formation process.

8 Claims, 10 Drawing Sheets

(A)

(B)

METHOD FOR SUPPRESSING PARTICLE GENERATION DURING SEMICONDUCTOR MANUFACTURING

CROSS REFERENCE TO RELATED APPLICATION

This application is a continuation of Ser. No. 11/802,358, filed May 22, 2007 (now abandoned), which is incorporated in its entirety herein by reference.

TECHNICAL FIELD

The present invention relates to semiconductor manufacturing system and particularly to coating apparatus for forming a film of a desired thickness by repeating atomic or molecular level deposition. More particularly, the invention relates to a technique of effectively precoating the inside of the reaction vessel to prevent the generation of particles.

BACKGROUND ART

With higher integration of semiconductor devices, the miniaturization of their device pattern progresses. For example, 1-gigabit dynamic random access memory (DRAM) has been used in practical applications. Such large capacity DRAM employs elements reduced in dimension and hence in surface area. Since DRAM uses the amount of charge stored on its memory cell capacitors as stored information, these capacitors must have a capacitance greater than a certain value. Therefore, memory cell capacitors currently have a very high aspect ratio. Conventionally, CVD (Chemical Vapor Deposition) is used to form capacitive dielectric films for capacitors. However, it is difficult by CVD to uniformly form a dielectric film in a high aspect ratio groove with a high coverage. In order to retain its stored data, a memory cell capacitor must have high capacitance and a low leakage current, which requires the formation of the thinnest possible uniform film.

In recent years, in order to solve this problem, ALD (Atomic Layer Deposition) has been used, which repeatedly deposits a thickness of a film material on the order of an atomic layer to form a film having a desired thickness.

A process, which repeatedly depositing a thickness of a film material on the order of a molecular layer to form a film having a desired thickness, is referred to as MLD (molecular layer deposition) to be distinguished from ALD in some cases. However, in this specification, the both techniques are commonly referred to as ALD, since they are based on the same principle. In a case where a hafnium oxide (hereinafter referred to as an "HfO") film is formed on a semiconductor substrate by ALD, a gas supply cycle consisting of the supply of tetrakis(ethylmethylamino)hafnium (hereinafter abbreviated as "TEMAH"), which is an organic metal material, and the supply of ozone ($O_3$) is repeated a plurality of times while maintaining the semiconductor substrate at a predetermined temperature. The reaction vessel is evacuated and purged by inert gas after the supply of one gas and before supply of the other to ensure that the gases react only on the semiconductor substrate. An HfO film having a thickness on the order of an atomic layer is formed on the semiconductor substrate during each cycle. The above gas supply cycle is repeated a predetermined number of times determined depending on desired thickness, so that an HfO film can be formed with excellent film-thickness reproducibility.

ALD is advantageous in its excellent film-thickness reproducibility, but is disadvantageous in its long film-forming time. For example, in forming an HfO film, one cycle deposits a film of approximately 0.1 nm. Thus, 50 cycles are required to form a film of thickness of 5 nm. If each cycle takes 1 minute, the total film forming time will be approximately 50 minutes. Therefore, the use of a batch-type system is preferable to a single substrate processing system in terms of productivity.

FIG. 5 shows the configuration of a conventional batch-type ALD system for forming an HfO film; and FIG. 6 shows a piping system associated with this system. Referring to FIG. 5, a vacuum exhaust port 1103 is provided at the top of a reaction tube 1102 defining a reaction chamber 1101. The vacuum exhaust port 1103 is connected to a vacuum pump 1105 through an evacuation pipe provided with a pressure adjusting valve 1104. A boat 1108 having a plurality of semiconductor substrates 1107 mounted therein is supported on a boat loader 1106 and loaded in the reaction chamber 1101. A heater 1109 is provided around the reaction tube 1102 to heat the semiconductor substrates.

Liquid TEMAH is supplied from a TEMAH supply source 1110 through a liquid flow rate adjuster 1111 to a vaporizer 1112, in which the liquid TEMAH is vaporized and a TEMAH gas, as a source gas, is then delivered into the reaction chamber 1101 through a TEMAH nozzle 1113. Nitrogen gas ($N_2$) is supplied from a nitrogen supply source 1114 to the vaporizer 1112 through a flow rate adjuster 1115 to aid vaporization of the liquid TEMAH. Oxygen gas ($O_2$) is supplied from an oxygen supply source (not shown) through a flow rate adjuster (not shown) to an ozone generator (not shown) in which the oxygen gas is converted into ozone which is an oxidizer. The ozone is then delivered into the reaction chamber 1101 through an ozone nozzle 1113. Further, nitrogen gas used as a purge gas is supplied from the nitrogen gas supply source 1114 to the reaction chamber 1101 through a flow rate adjuster 1116 and a nitrogen gas nozzle 1113. There are plural nozzles 1113 each dedicated to a different gas, although only one nozzle 1113 is shown in FIG. 5 for simplicity.

When HfO films are formed on the semiconductor substrates using the system having the configuration shown in FIG. 5, there may be a difference in thickness or quality of the films between the semiconductor substrates mounted in the lower portion and the upper portion of the boat 1108. The reason is that the semiconductor substrates disposed in the upper portion of the reaction chamber 1101 cannot receive sufficient amounts of TEMAH gas and ozone, since the TEMAH gas and the ozone delivered from L-shaped nozzles 1113, which are provided in the lowest portion of the reaction chamber 1101, are mostly consumed by the reaction occurring in the lower portion of the reaction chamber 1101. Unlike CVD, in ALD, the supply of excessive amount of source gas does not result in formation of an unnecessarily large film thickness. Therefore, excessive TEMAH gas may be supplied into the reaction chamber 1101 to cause a sufficient amount of TEMAH gas to reach the upper portion of the reaction chamber 1101. On the other hand, ozone has a short life under elevated temperature conditions. Therefore, the supplied ozone progressively disappears as it flows from the lower portion to the upper portion of the reaction chamber 1101 and, as a result, the upper portion of the reaction chamber 1101 is more likely to lack ozone. To solve this problem, it may be conceived that an excessive amount of ozone may be supplied to the reaction chamber 1101. However, the supply of an excessive amount of ozone causes oxidation damage to the components in the lower portion of the reaction chamber 1101, which is not desirable. Furthermore, ozone is consumed by this oxidation reaction.

In order to solve these problems, a distributing nozzle(s) 1117 such as shown in FIG. 7 may be used. The distributing nozzle 1117 extends from the bottom to the top of the reaction chamber 1101 and includes nozzle holes 1118 each corresponding to respective semiconductor substrates mounted in the boat 1118. This arrangement allows processing gas, especially ozone, to be uniformly supplied to the semiconductor substrates. It should be noted that the TEMAH gas may be supplied through an L-shaped nozzle shown in FIG. 5 or the distributing nozzle shown in FIG. 7.

Incidentally, particle reduction is a critical issue in semiconductor manufacturing. When a film is formed on the semiconductor substrates by CVD, ALD, or other chemical deposition process, deposition of unnecessary films unavoidably occurs on the inner wall of the reaction tube and on the various components that are exposed to the atmosphere within the reaction vessel. Peeling-off of the unnecessary films is a major cause of the generation of particles, as is well known to those of ordinary skill in the art. Peeling-off of the unnecessary films tends to occur when the unnecessary films have a large thickness or when the inside of the reaction vessel is exposed to the ambient atmosphere. For example, generation of a large quantity of particles was found after the inside of reaction vessel was exposed to the ambient atmosphere for maintenance or repair after performing deposition of HfO films for many times. Analysis of these particles by EDX (energy dispersive X-ray spectroscopy) revealed that they were formed of hafnium oxide. It is thought that the above generation of particles resulted from the fact that HfO films formed on the inner wall of the reaction tube absorbed moisture and thereby peeled off when the inside of the reaction tube was exposed to the ambient atmosphere for maintenance. It was not possible to visually recognize the HfO particles since their sizes were very small (mostly 10 microns or less).

One of the possible countermeasures against the generated particles is cycle purging. A trial was conducted to reducing particles by using the cycle purging. The purging was performed by repeating a cycle consisting of an ozone flowing step, an evacuating step, and a nitrogen gas flowing step 50 times (spending approximately 3 hours), as shown in FIG. 9. In FIG. 9, the horizontal axis is graduated in 15 sec increments. The ozone concentration in the ozone flowing step was 200 g/Nm$^3$; the oxygen flow rate before the oxygen-to-ozone conversion (corresponding to the ozone flow rate) was 10 SLM; the pressure in the reaction vessel in the evacuating step was approximately 5 Pa; and the nitrogen gas flow rate in the nitrogen gas flowing step was 10 SLM. Dummy semiconductor substrates were placed in the boat and heated to 300° C. The number and distribution of particles on the dummy semiconductor substrates were observed after completion of every predetermined number of cycles. Various particle distribution patterns were found: locally concentrated patterns sparsely distributed patterns, etc. FIGS. 10A and 10B show two examples of the observed particle distribution patterns. FIG. 11 shows change in the number of particles. The number of particles was not stably reduced even after more than 200 purge cycles (spending approximately 12 hours). Under such conditions, a deposition process can not be performed.

Another possible countermeasure against the generated particles is cleaning. However, there is no established method for removing an HfO film by in-situ dry cleaning. Wet cleaning, on the other hand, requires disassembly of the system, resulting in significant downtime. Furthermore, wet cleaning should not be frequently performed, since it shortens the life of the quartz components. Replacement of components results in shorter downtime. However, it is not practical since quartz components are expensive.

SUMMARY OF THE INVENTION

The present invention has been devised in view of the foregoing circumstances, and it is therefore the object of the present invention to provide an effective, in-situ method of taking countermeasure against particles.

The present inventors have found that, also in a coating apparatus that forms a film on semiconductor substrates by repeated atomic or molecular level depositions, a precoating process that coats unnecessary film(s) with another film is useful for reducing particles. It has also been found that such a precoating process can be performed very effectively, if the gas supply mode during precoating is different from the gas supply mode during film formation, in particular, if a gas nozzle for a precoating gas is provided separately from a gas nozzle for film formation. The present invention has been made based on those findings.

Specifically, the present invention provides a semiconductor manufacturing system including a reaction vessel and at least one film-forming nozzle for supplying at least one film-forming gas into the reaction vessel, configured to form a film on a semiconductor substrate disposed within the reaction vessel by supplying the film-forming gas into the reaction vessel to repeat atomic or molecular level deposition, wherein the semiconductor manufacturing system further includes at least one coating nozzle for supplying at least one kind of coating gas into the reaction vessel to coat a component exposed to an atmosphere within the reaction vessel, wherein at least one of said at least one coating nozzle is separated from said at least one film-forming nozzle.

In one preferred embodiment, the at least one kind of film-forming gas includes a first film-forming gas and a second film-forming gas, and the at least one coating gas includes a first coating gas and a second coating gas; the first film-forming gas is the same as the first coating gas; and a coating nozzle for supplying the first coating gas is separated from a film-forming nozzle for supplying the first film-forming gas.

In one preferred embodiment, the second film-forming gas is a metal-containing gas; the second coating gas is a metal-containing gas, and both the first film-forming gas and the first coating gas are ozone. The at least one kind of film-forming gas may include a third film-forming gas, and the third film-forming gas may be the same as the second coating gas.

In one preferred embodiment, the semiconductor manufacturing system is a batch-type system adapted to contain a plurality of semiconductor substrates in the reaction vessel to perform a film forming process to the semiconductor substrates collectively, the reaction vessel has an exhaust port for evacuating an interior of the reaction vessel, the film-forming nozzle for supplying the first film-forming gas is a distributing nozzle having a plurality of nozzle holes for discharging the first film-forming gas toward the plurality of semiconductor substrates from their sides, and the coating nozzle for supplying the first coating gas has a nozzle hole which opens in the reaction vessel at a position farther from the exhaust port than a region in which the plurality of semiconductor devices are disposed. The semiconductor manufacturing system may be a vertical, batch-type system that accommodates a plurality of semiconductor substrates arrayed vertically in horizontal posture in the reaction vessel, and performs a film-forming process to the semiconductor substrates collectively.

In the most typical embodiment of the present invention described later with reference to the accompanying drawings, the first film-forming gas is ozone; the second film-forming gas is TEMAH gas; the third film-forming gas is trimethyl aluminum (hereinafter abbreviated as "TMA") gas; the first precoating gas is ozone; and the second precoating gas is TMA gas. Further, the semiconductor manufacturing system is a vertical, batch-type system that accommodates a plurality of semiconductor substrates arrayed vertically in horizontal posture in the reaction vessel, and performs a film-forming process to the semiconductor substrates collectively. Further, the film-forming nozzle for supplying the first film-forming gas (i.e., ozone) is a distributing nozzle having a plurality of nozzle holes for discharging the first film-forming gas toward the plurality of semiconductor substrates from their sides; and the coating nozzle for supplying the first coating gas (i.e., ozone) is an L-shaped nozzle having a nozzle hole which opens in the reaction vessel at a position farther from an exhaust port than a region in which the plurality of semiconductor devices are disposed. Ozone is a short-lived gas. Such a gas is supplied through the distributing nozzle during film formation, but is supplied from a position far away from the exhaust port during precoating so that the gas uniformly spreads within the vessel. Thereby, a film of high quality can be obtained during film formation, while the entire inside of the reaction vessel can be coated with a precoat film of high quality with a small number of deposition cycles during precoating. In this way, it is possible to effectively prevent generation of particles, and the system can restart in a short time period after maintenance of the system.

DETAILED DESCRIPTION OF THE INVENTION

The present invention will be described in detail with reference to the results of studies and experiments conducted by the present inventors to achieve the invention.

A precoating technique has been used to prevent the generation of particles resulting from peeling-off of unnecessary films in CVD apparatus. The precoating technique coats potentially peelable unnecessary films with a film (e.g., an $SiO_2$ film) to prevent peeling-off of the unnecessary films. The present inventors have tried to extend this technique.

Figure 12:
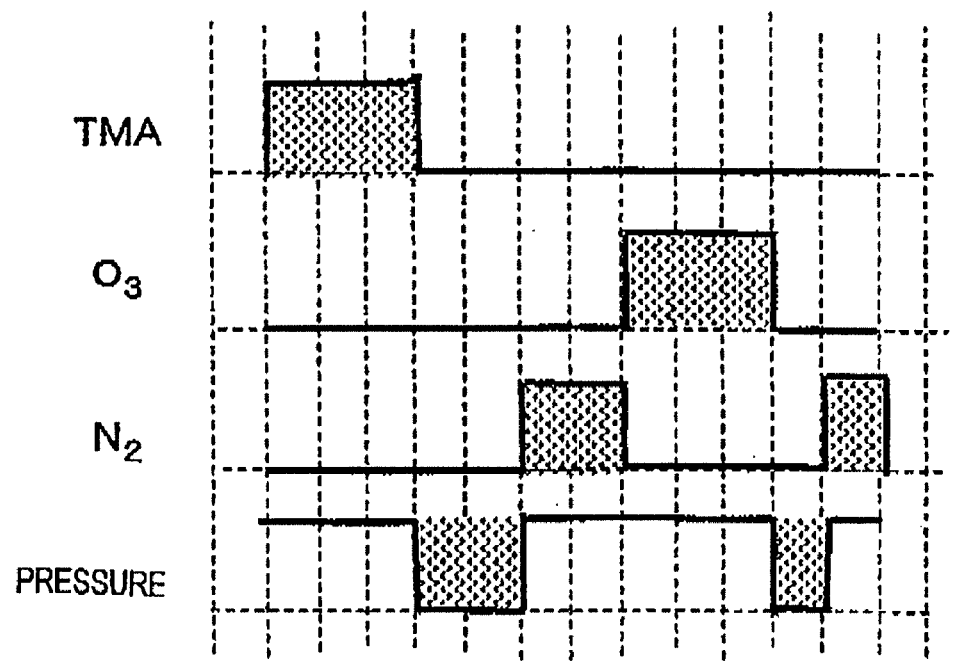
FIG. 12 is a time chart illustrating a precoat process.

The present inventors conducted an experiment in which an HfO film was coated with an aluminum oxide (hereinafter referred to as an "AlO") film. The AlO film was formed by an ALD process that repeats, a plurality of times, a deposition cycle consisting of a TMA gas flowing step, an evacuating step, a nitrogen gas flowing (purging) step, an ozone flowing step, an evacuating step, and a nitrogen gas flowing (purging) step which were performed in that order, as shown in FIG. 12. In FIG. 12, the horizontal axis is graduated in 5 sec increments. This deposition cycle was performed under the following process conditions. The TMA gas flow rate in the TMA gas flowing step was 100 SCCM; the ozone concentration in the ozone flowing step was 200 $g/Nm^3$; the oxygen flow rate before the oxygen-to-ozone conversion (corresponding to the ozone flow rate) was 10 SLM; the pressure in the reaction vessel after each evacuating step was approximately 5 Pa; and the nitrogen gas flow rate in the nitrogen gas flowing step was 10 SLM. Several dummy semiconductor substrates were placed in the boat and heated to 300° C. Under the aforementioned conditions, 0.1 nm of AlO film was deposited in each cycle. Thus, a 10 nm thick AlO film was formed by 100 cycles. 100 cycles spent approximately 2.5 hours.

Figure 7:
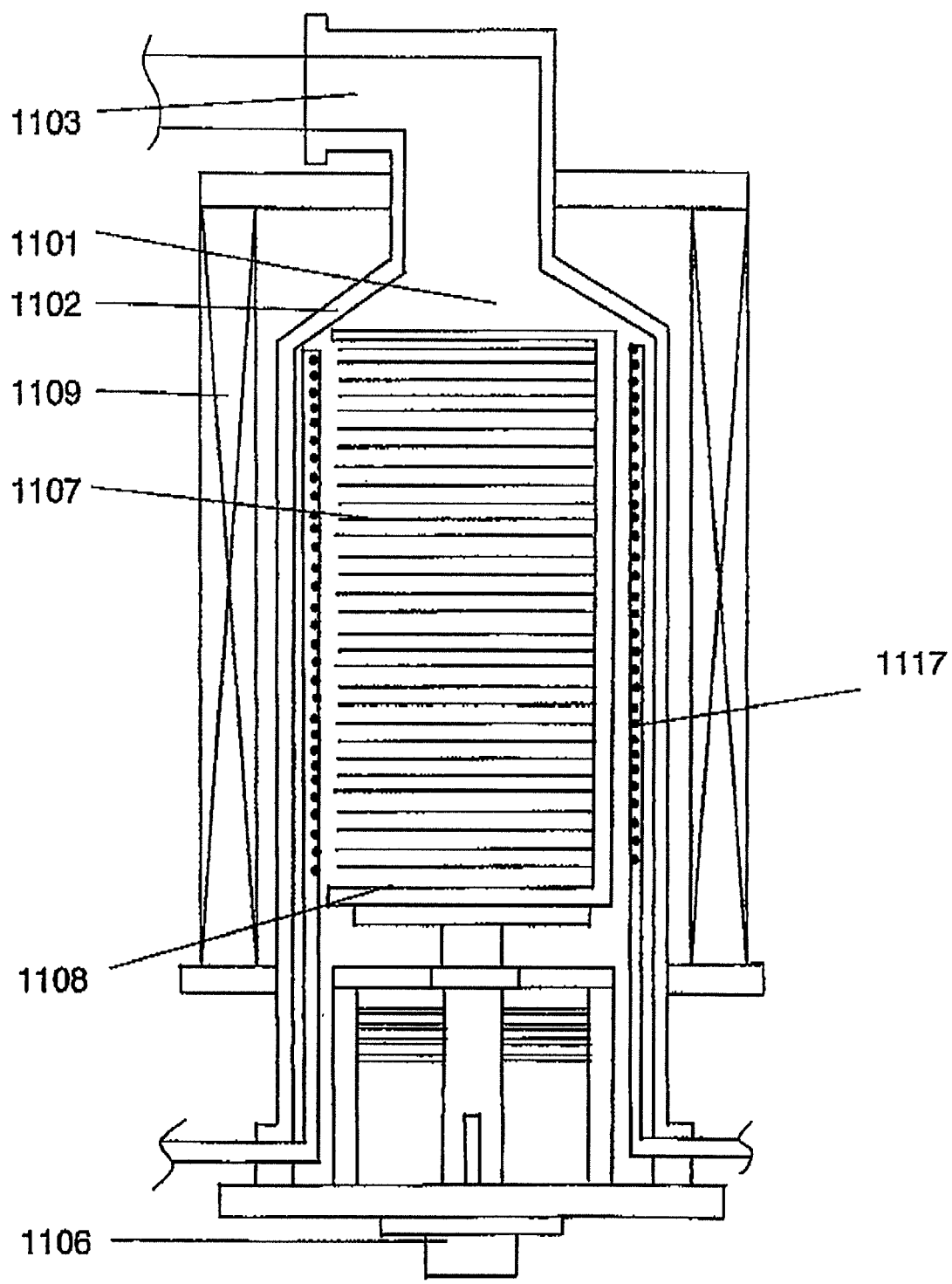
FIG. 7 is a schematic vertical cross-sectional view of another example of the conventional ALD apparatus.

This experiment was performed, using an ALD apparatus of the type shown in FIG. 7 (employing distributing nozzles), according to the following steps:

(1) performing a conventional, batch, HfO film coating process and then exposing the reaction tube to the ambient atmosphere;

(2) performing 100 cycles of ALD precoating process under the foregoing conditions;

(3) performing a conventional, batch HfO film coating process in the precoated reaction tube and then counting the number of particles on the semiconductor substrates; and (4) repeating step (2) and step (3).

Figure 13:
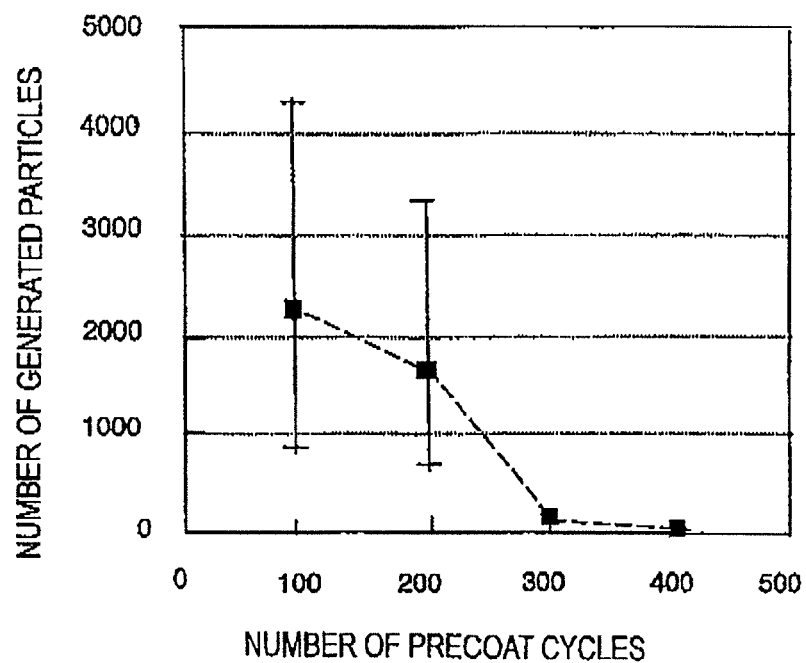
FIG. 13 is a graph showing a relationship between the number of precoat cycles and the number of particles.
Figure 14:
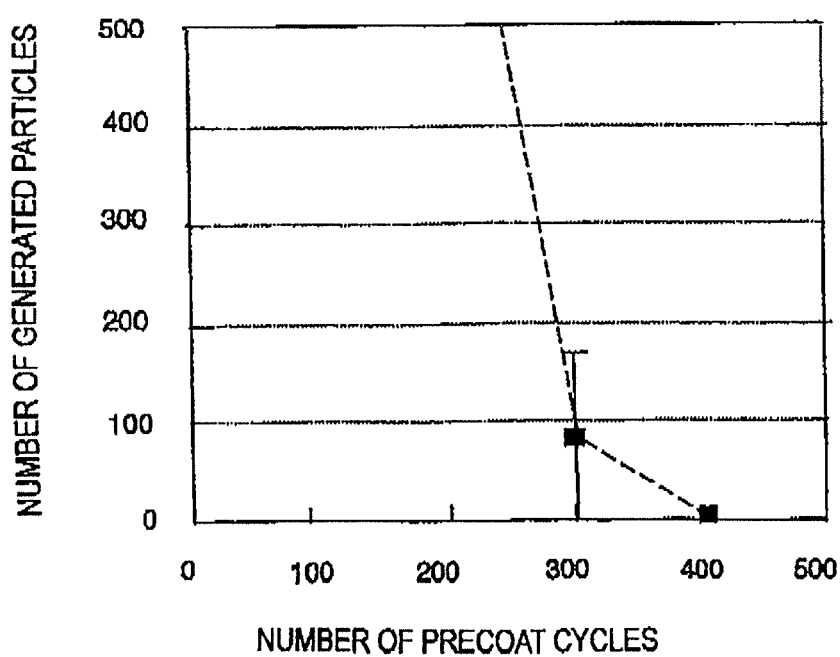
FIG. 14 is an enlarged view of a portion of the graph of FIG. 13.

FIGS. 13 and 14 are graphs illustrating the results of the experiment. FIG. 14 is an enlarged view of a portion of the graph of FIG. 13 (both graphs are based on the same data.) As is apparent from FIGS. 13 and 14, the number of the particles was stably reduced after 400 precoating cycles (the resultant AlO precoat film thickness was 40 nm).

The experiment indicates that AlO film precoating is useful for preventing peeling-off of the HfO film. However, it takes approximately 10 hours to complete 400 precoating cycles. This precoating process takes much longer time to complete than conventional $SiO_2$ film precoating processes by CVD and therefore is not practical for most applications.

The present inventors also attempted to combine the above cycle purging process and the AlO film precoating process, but with no practically useful results. Approximately 400 cycles of AlO film precoating were needed to reduce the number of particles regardless of the number of purge cycles.

The inventors endeavored to develop a technique of effectively forming an aluminum oxide precoating to sufficiently prevent peeling-off of the film. In the course of the development of such a technique, the inventors have come to a hypothesis that the use of the distributing nozzle, which is used to effectively supply ozone during desired film formation, rather avoids formation of a high-quality precoating.

Figure 3:
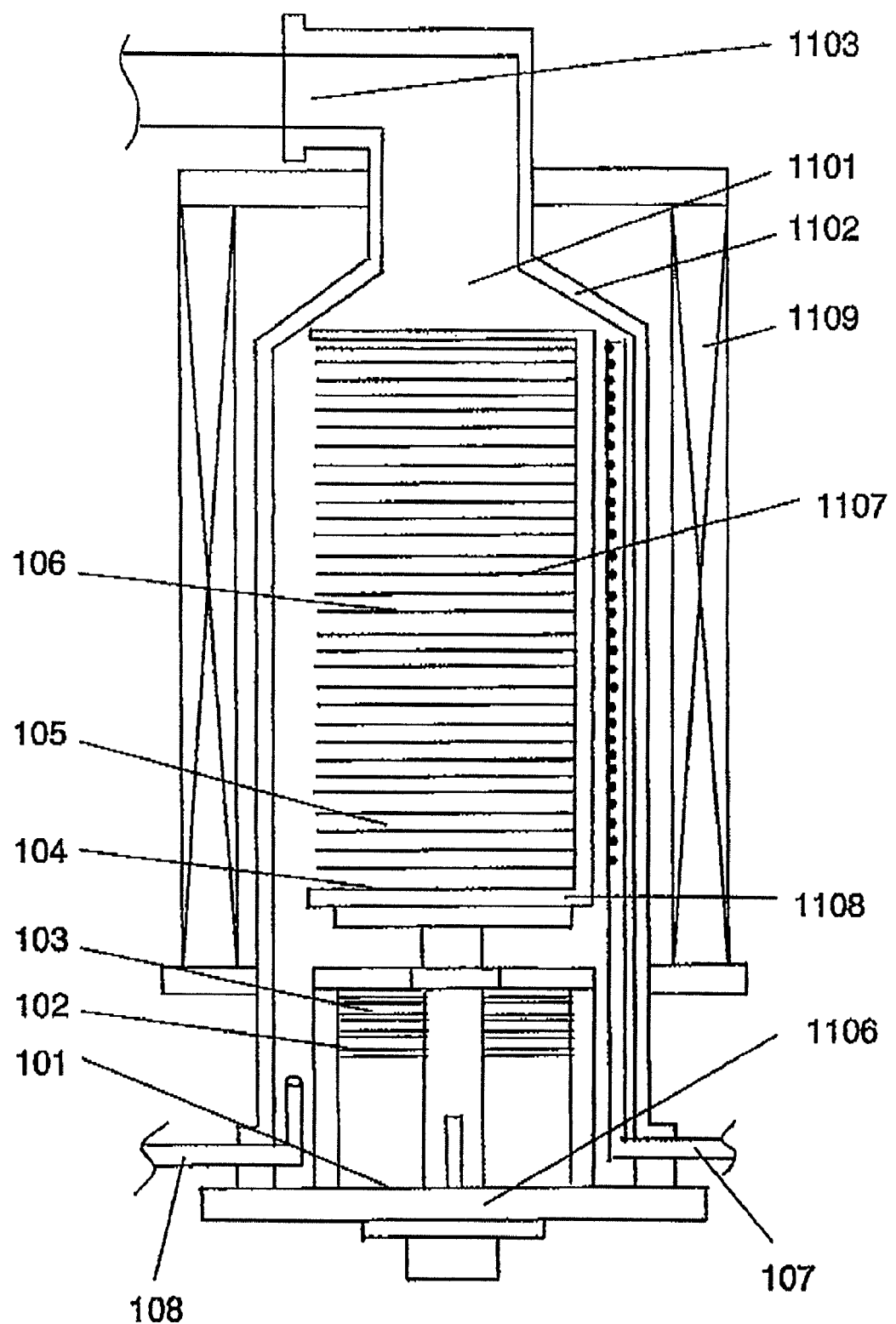
FIG. 3 is a vertical cross-sectional view schematically showing the configuration of an ALD apparatus according to the present invention.

To verify this hypothesis, an experiment was performed by using the ALD apparatus shown in FIG. 3. Note that the ALD apparatus shown in FIG. 3 is a film-forming system (semiconductor manufacturing system) in one embodiment of the present invention, as can be seen from the following description. The ALD apparatus shown in FIG. 3 will now be described.

Figure 5:
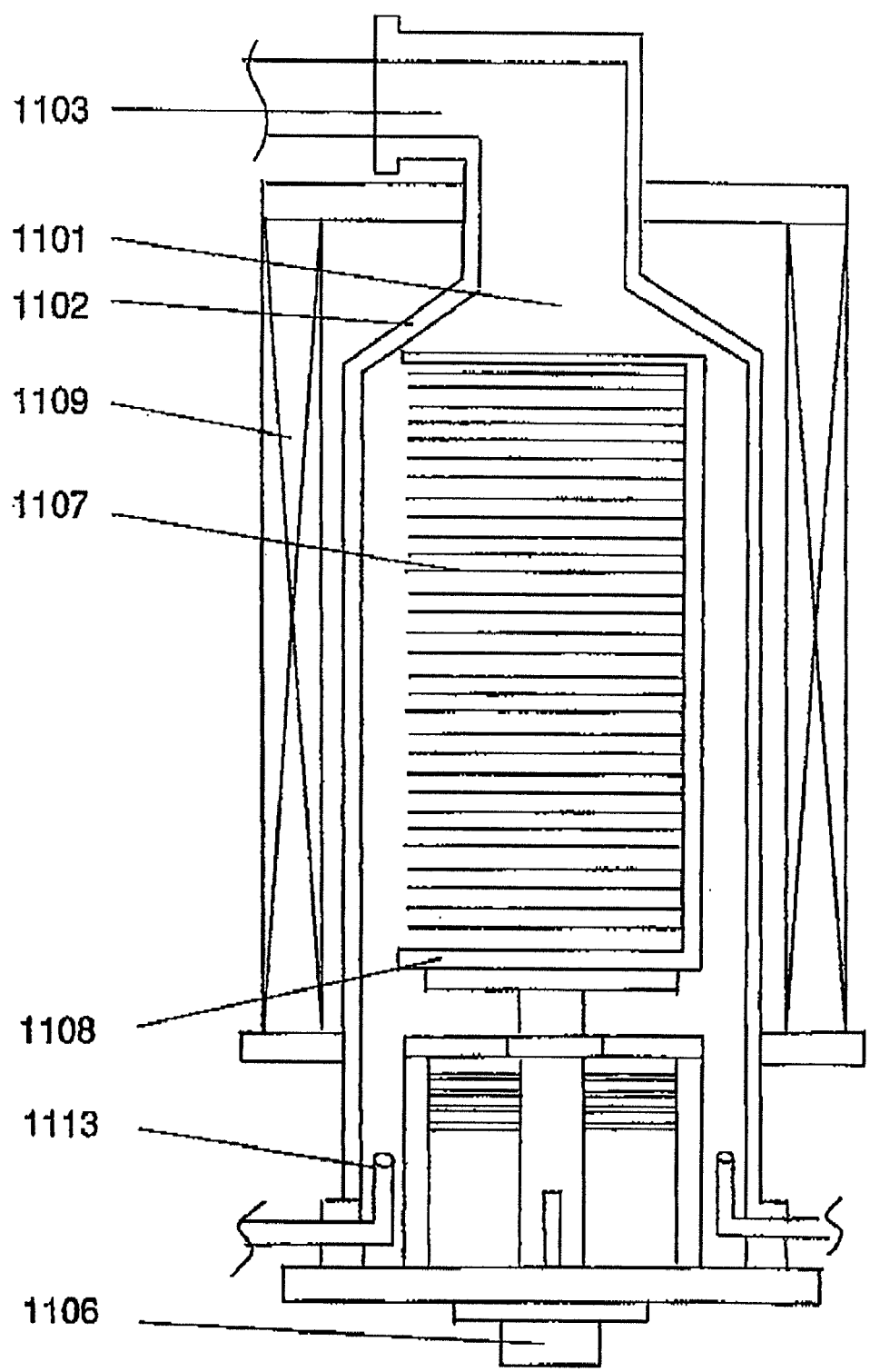
FIG. 5 is a schematic vertical cross-sectional view showing an example of a conventional ALD apparatus.
Figure 6:
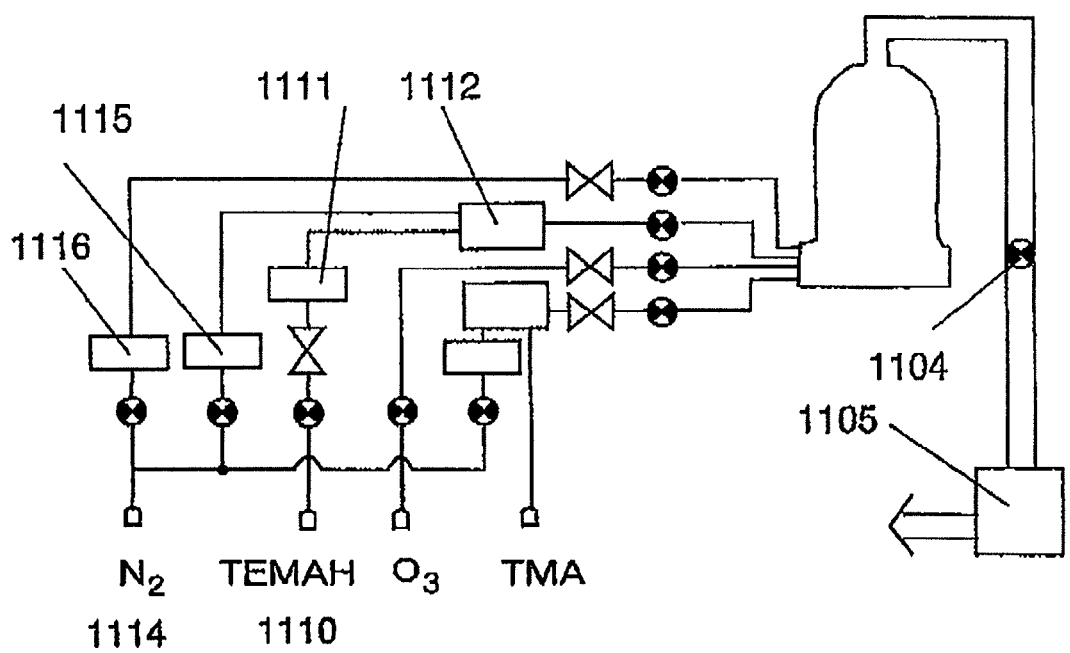
FIG. 6 is a diagram showing a piping system in the ALD apparatus shown in FIG. 5.

The ALD apparatus shown in FIG. 3 differs from those described in the "Background Art" section with reference to FIGS. 5 and 7 in that it has a different gas supply system. Duplicative description of the same components is thus omitted.

The ALD apparatus shown in FIG. 3 includes a distributing nozzle 107 and L-shaped nozzles 108. The distributing nozzle 107 extends vertically within the reaction chamber 1101 in the longitudinal direction of the boat 1108, that is, in the direction of arrangement of the semiconductor substrates. The distributing nozzle 107 is configured to jet a gas, through nozzle holes thereof each arranged at positions corresponding to respective semiconductor substrates, toward respective semiconductor substrates from their sides. Each L-shaped nozzle 108 is provided at the lowest peripheral portion of the reaction chamber 1101 and configured to supply a gas through a single nozzle hole thereof from the bottom toward the top of the boat 1108. Note that, in the ALD apparatus shown in FIG. 3, all components exposed to the atmosphere within the reaction chamber 1101 are either formed of quartz or covered with quartz.

The gas supply system for the ALD system shown in FIG. 3 is adapted to form an HfO film and an AlO film on the semiconductor substrates, as well as to form an AlO film as a precoat film on the inner wall of the reaction tube and on the inner components of the reaction vessel that are exposed to the atmosphere within the reaction vessel.

Figure 4:
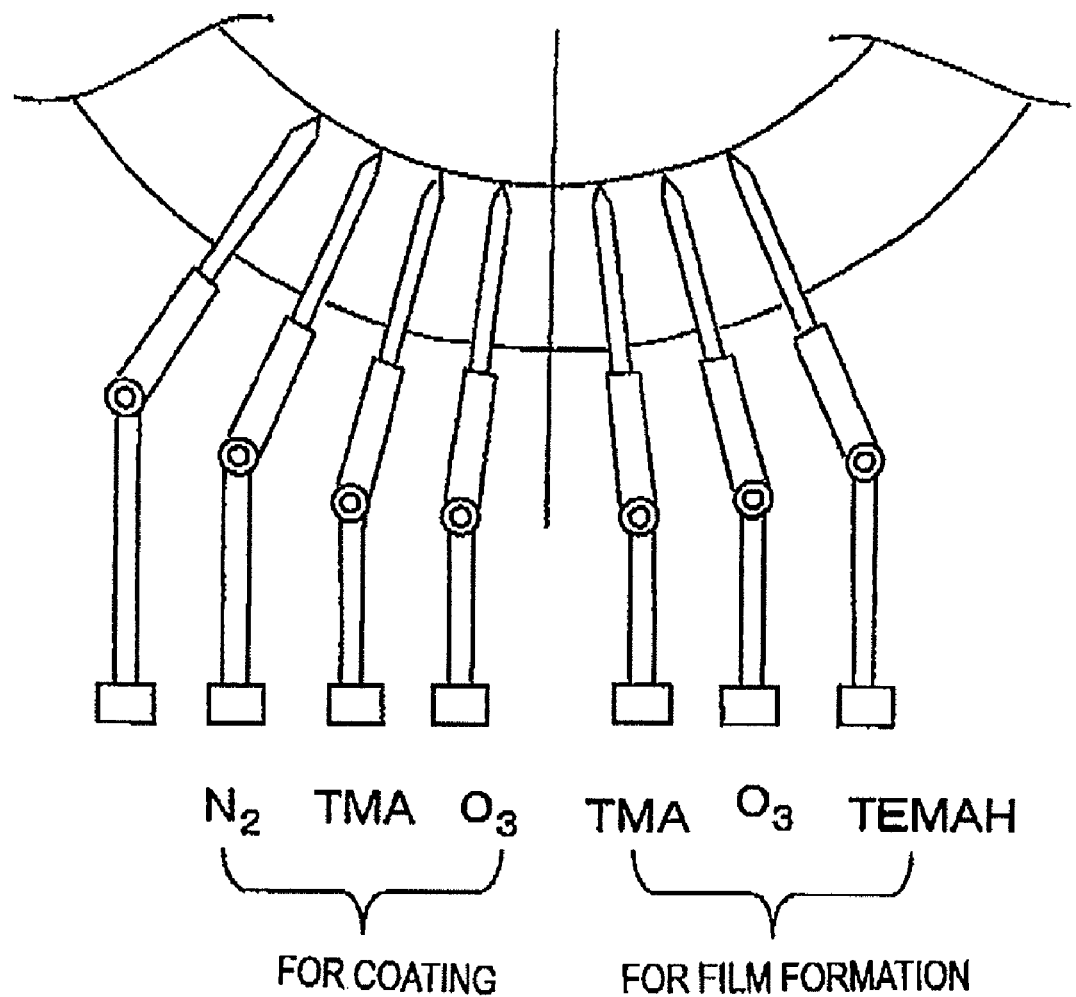
FIG. 4 is a schematic diagram showing a gas introducing portion of the ALD apparatus according to the present invention.
Figure 8:
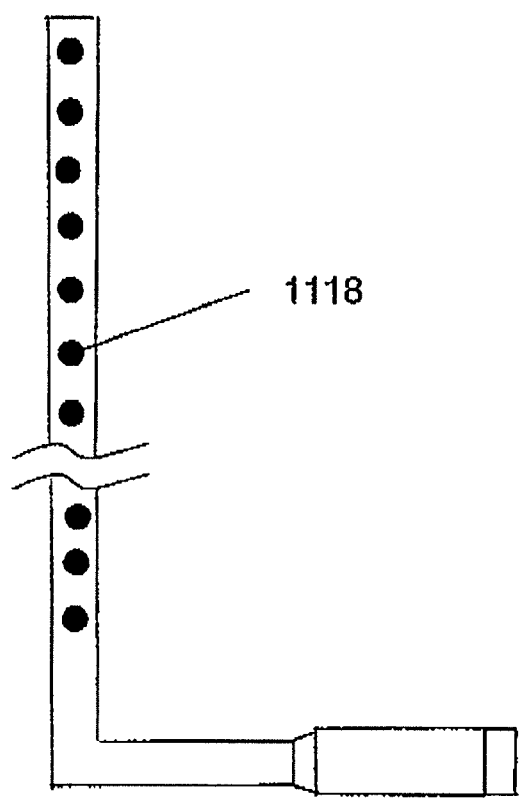
FIG. 8 is a side view schematically showing the configuration of a distributing nozzle.
Figure 9:
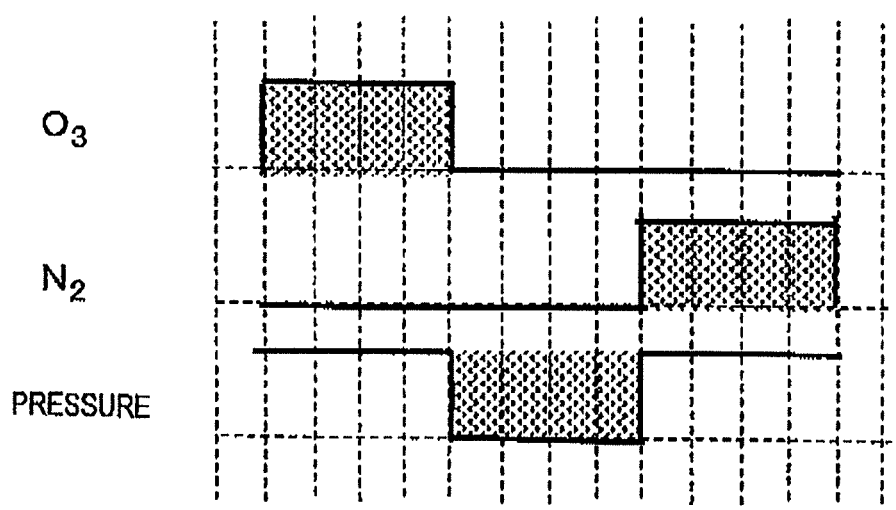
FIG. 9 is a time chart illustrating a cycle purge process.
Figure 10:
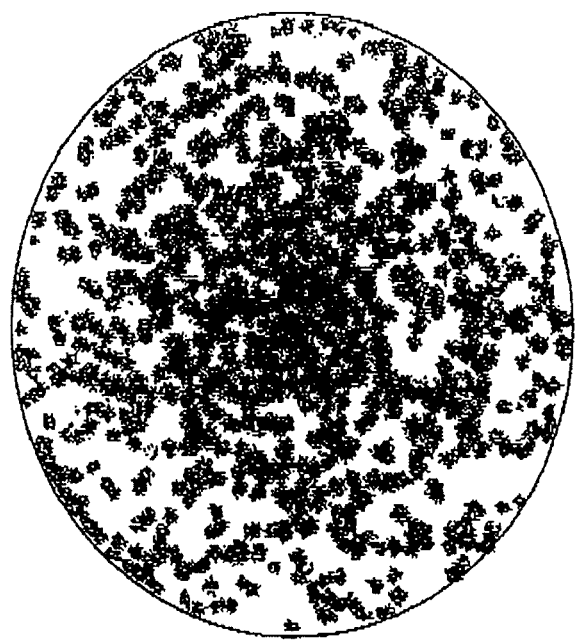
FIG. 10 is a diagram showing the distribution of particles on semiconductor substrates in one example.
Figure 10:
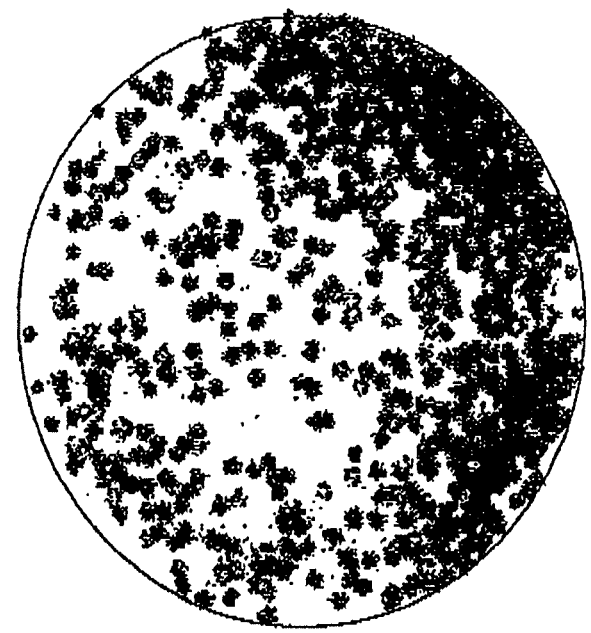
Figure 11:
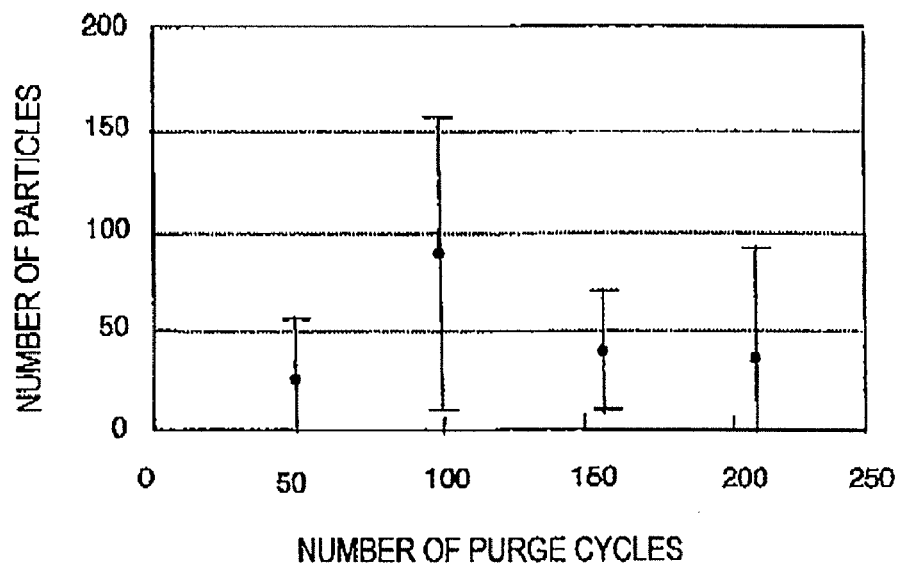
FIG. 11 is a graph showing a relationship between the number of purge cycles and the number of particles.

FIG. 4 is a schematic horizontal cross-sectional view of the manifold, or gas introducing portion, mounted in the lowermost portion of the reaction tube (or reaction vessel) 1102 of the ALD apparatus shown in FIG. 3. Gas lines for introducing various gases into the reaction chamber 1101 penetrate through the manifold. The distributing nozzle 107 (see FIG. 8) or the L-shaped nozzle 108 (not shown in FIG. 4) is coupled to the tip of each gas line to discharge a gas into the reaction chamber 1101. The gas supply system for the ALD apparatus shown in FIG. 3 includes: an L-shaped nozzle connected to a TEMAH gas line to supply TEMAH gas when forming HfO films on the semiconductor substrates; an L-shaped nozzle connected to a TMA gas line to supply TMA gas when forming AlO films on the semiconductor substrates; the distributing nozzle connected to an ozone line to supply ozone when forming the both HfO films and AlO films on the semiconductor substrates; an L-shaped nozzle connected to a TMA gas line to supply TMA gas when forming precoat films on the inner components of the reaction vessel; and an L-shaped nozzle connected to an ozone line to supply ozone when forming precoat film on the inner components of the reaction vessel. Only some of these nozzles are shown in FIG. 3 for simplicity.

Note that, when an HfO film is formed as a capacitive dielectric film, it is common to form an AlO film on the HfO film to provide enhanced insulation. Therefore, the ALD apparatus shown in FIGS. 3 and 4 includes a nozzle for forming an AlO film on the semiconductor substrates, as described above.

Note that, the ALD apparatus may further include a nitrogen gas supply nozzle for purging (preferably having an L-shape) (see FIG. 4). However, the nitrogen gas used as a purge gas is more preferably supplied through nozzles for supplying TEMAH gas and TMA gas. There may be a plurality of nozzles each having the same task. Further, a plurality of nozzles may be disposed locally and collectively, as shown in FIG. 4, or they may be distributed along the circumference of the reaction tube 1102.

The nozzle holes of the L-shaped nozzles 108, especially those for supplying precoating gases, are arranged at positions ensuring that the gases discharged from the nozzles is sufficiently supplied to the surfaces of the components in the lower portion of the reaction chamber 1101, such as a plate-like member which is a part of the boat loader 1106 (i.e., the cover for closing the lower end opening (furnace throat) of the reaction tube 1102) and a insulating tube. Preferably, the nozzle holes of the L-shaped nozzles 108 for supplying precoating gases are arranged in the reaction chamber 1101 at positions farthest from the vacuum exhaust port 1103. In the example shown in FIG. 3, the nozzle holes of the L-shaped nozzles 108 are located approximately 100 mm above the bottom surface of the reaction chamber 1101, i.e., the top surface of the cover described above.

Next, an experiment conducted by using the ALD apparatus shown in FIG. 3 will be described.

(1) A conventional, batch HfO film coating process (by ALD) was performed a predetermined number of times by using the ALD apparatus shown in FIG. 3. The inside of the reaction vessel was then exposed to the ambient atmosphere. At that time, the TEMAH gas was supplied through the L-shaped nozzle 108 and the ozone was supplied through the distributing nozzle 107.

(2) 100-cycle AlO precoating process was performed by ALD. The AlO precoating process was performed by repeating, a plurality of times, an ALD deposition cycle consisting of a TMA gas flowing step, an evacuating step, a nitrogen gas flowing (purging) step, an ozone flowing step, an evacuating step, and a nitrogen gas flowing (purging) which are performed in that order, as shown in FIG. 12. In FIG. 12, the horizontal axis is graduated in 5 sec increments. The TMA gas flow rate in the TMA gas flowing step was 100 SCCM; the ozone concentration in the ozone flowing step was 200 $g/Nm^3$; the oxygen flow rate before the oxygen-to-ozone conversion (corresponding to the ozone flow rate) was 10 SLM; the pressure in the reaction vessel in the evacuating steps was approximately 5 Pa; and the nitrogen gas flow rate in the nitrogen gas flowing step was 10 SLM. Several dummy semiconductor substrates were placed in the boat and heated to 300° C. Both the TMA gas and ozone were supplied through the L-shaped nozzles.

(3) A conventional, batch HfO film forming process (by ALD) was performed once, and then the semiconductor substrates were checked for particles. The HfO film forming conditions may be understood just by substituting "TEMAH" for "TMA" in FIG. 12. The TEMAH gas flow rate in the TEMAH gas flowing step was 1 ml/min (liquid basis). The flow rates of the other gases and the temperature and pressure conditions were the same as those for forming the AlO film described above. At that time, the TEMAH gas was supplied through an L-shaped nozzle 108 and the ozone was supplied through the distributing nozzle 107.

Figure 1:
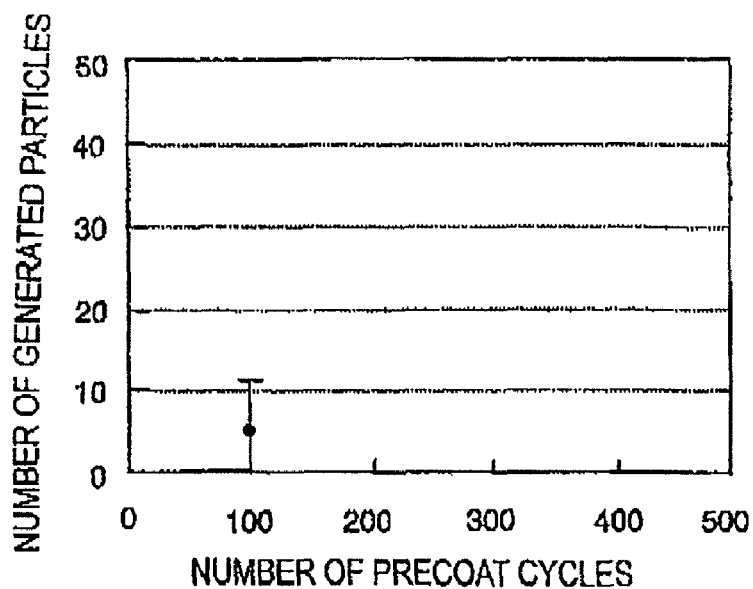
FIG. 1 is a graph showing the number of generated particles after performing precoating according to the present invention.

As shown in the graph of FIG. 1, as a result of the 100-cycle precoating, the number of particles (larger than 0.12 microns in size) generated after the subsequent HfO film formation was 20, sufficiently small. It took approximately 2.5 hours to complete the 100-cycle precoating. It was thus found that the time required for precoating was reduced to quarter as compared with the case where a distributing nozzle was used as an ozone supply nozzle in which the time required for precoating was approximately 10 hours, as previously described with reference to the previous experiment result.

Silicon pieces were placed at positions 101 to 106 within the reaction chamber 1101 before the above step (2) (see FIG. 3). The position 101 is located on the inner surface of the cover of the boat loader 1006 (lower than the nozzle holes of the L-shaped gas supply nozzles 108); the positions 102 and 103 are on heat shielding plates of the heat insulating tube of the boat loader 1006; the position 104 is on the bottom of the boat 1108; the position 105 is on the dummy semiconductor substrate placed in the lower portion of the boat 1108; and the position 106 is on the dummy semiconductor substrate placed in the central portion of the boat 1108. The thickness of the AlO precoat film formed on each silicon pieces was measured after the above step (2). In addition, a comparative experiment was performed in which: a distributing nozzle for forming the HfO film was used instead of an L-shaped gas supply nozzle to supply ozone when forming the AlO precoat film (the other conditions are the same as in the above experiment); and the thickness of the AlO precoat film formed on the silicon pieces at each of the positions 101 to 106 was also measured.

Figure 2:
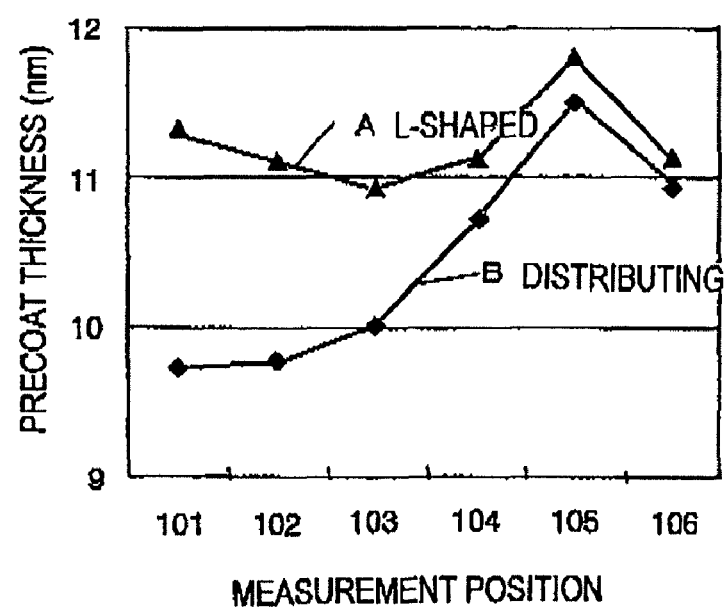
FIG. 2 is a graph showing the thickness distribution of precoat films.

FIG. 2 is a graph illustrating the results of these experiments. In FIG. 2, symbol A denotes the thickness of the precoat film formed when the ozone was supplied through an L-shaped gas supply nozzle; and symbol B denotes the thickness of the precoat film formed when the ozone was supplied through the distributing gas supply nozzle. At the positions 104, 105 and 106 in the boat 1108, there was no difference in the thickness of the AlO precoat films depending on the type of the nozzle. On the other hand, at the positions 101, 102 and 103, which are lower than the boat, the AlO precoat film formed by using the L-shaped gas supply nozzle was approximately 15% thicker than that formed by using the distributing gas supply nozzle.

The results of the experiments are summarized below.

(a) In the case where the ozone was supplied through the distributing gas supply nozzle, the number of particles was reduced to a non-problematic level when the thickness of the AlO precoat film reached approximately 40 nm (400-cycle precoating).

(b) In the case where the ozone was supplied through the L-shaped gas supply nozzle, the number of particles was reduced to a non-problematic level when the thickness of the AlO precoat film reached approximately 11 nm (100-cycle precoating).

(c) At positions lower than the boat, the AlO precoat film formed by using the L-shaped gas supply nozzle was thicker than that formed by using the distributing gas supply nozzle, but only by 15%, after 100-cycle AlO precoating.

The present inventors think the reasons for the above results (a), (b), and (c) are the following.

It is apparent that peeling off of the HfO film and hence the generation of particles can be more effectively prevented in the case where an AlO precoat film is formed by supplying ozone using an L-shaped gas supply nozzle, as compared with the case where a distributing gas supply nozzle is used. The reason for this relates to the quality or covering properties of the precoat film rather than its thickness. If ozone is supplied through the distributing gas supply nozzle, it takes a long time for the ozone to reach the lower region of the reaction vessel opposite to the vacuum exhaust port. Thus, a significant amount of ozone may disappear before reaching that region. As a result, the AlO precoat film of good quality can not be formed in the lower region of the reaction vessel. Thus, a large thickness is required in order to achieve the desired precoating effect with an AlO precoat film of poor quality. On the other hand, when the ozone is supplied through an L-shaped gas supply nozzle, it uniformly fills the reaction vessel and flows smoothly from the nozzle toward the vacuum exhaust port. This allows the precoat film to be of good quality and hence have the desired precoating effect even if it has a relatively small thickness. Note that the boat holds no wafer or only several dummy wafers during the precoating process. Therefore, it is not disadvantageous that the L-shaped gas supply nozzle is located far away from the exhaust port.

Although the present invention has been described, taking formation of an HfO film and an AlO precoat film as an example, based on an ALD system having a specific structure, the prevent invention is not limited to the foregoing embodiments. It will be appreciated by those skilled in the art that the broadest scope of the present invention is that, if the position of a nozzle for forming a film on the semiconductor substrates (i.e., a film-forming gas nozzles) are not suitable for forming a precoat film, a nozzle for supplying a process gas to form a precoat film (a precoating gas nozzle) may be provided separately from the film-forming gas nozzle, allowing the process gas for precoating to be supplied to an appropriate location within the reaction vessel. Therefore, in a case where another type of film is formed, the present invention is applicable. Further, the present invention has been described while focusing on the nozzle for supplying ozone gas when forming a film on the semiconductor substrates and to the nozzle for supplying ozone gas for precoating. Since ozone has a short life, it is true that the advantageous effect of the present invention is best achieved by providing different nozzles for supplying ozone when forming a film on the semiconductor substrates and for supplying ozone when forming a precoat film to allow ozone to be supplied from optimum positions. However, for example, it is possible that, for example, when forming an AlO film on the semiconductor substrates, the TMA gas may be supplied through a distributing nozzle. In this case, it is considered that an AlO precoat film of better quality (although the difference may not be so large as compared with a case of ozone) can be formed by using an L-shaped gas supply nozzle as a nozzle for supplying the TMA gas during precoating. In addition, it will be appreciated by those skilled in the art that the advantageous effects of the present invention may be expected not only in a case where the film to be formed on the semiconductor substrates is an HfO film and the precoat film is an AlO film, but also in a case those films are of different types (although the advantageous effect may not be the same degree). Further, although the present invention achieves most remarkable advantageous effects if it is applied to a vertical batch system, the advantageous effects can be achieved even if the present invention is applied to another type of batch system or a single substrate processing system.

The invention claimed is:

1. A method of operating a semiconductor manufacturing system comprising:

placing a plurality of substrates in a reaction vessel with the substrates being arrayed at vertical intervals within a substrate placing region in the reaction vessel;

thereafter, supplying at least one kind of film-forming gas into the reaction vessel through at least one film-forming nozzle, thereby forming a deposition film on the substrates by repeating atomic or molecular layer deposition;

thereafter, removing the substrates from the reaction vessel;

thereafter, placing a dummy substrate, or no substrate, in the substrate placing region of the reaction vessel; and thereafter, supplying at least one kind of coating gas from a position below the substrate placing region into the reaction vessel while the dummy or no substrate is therein through at least one coating nozzle, thereby forming a coating film over the deposition film formed due to the atomic or molecular level deposition on a component of said semiconductor manufacturing system exposed to an atmosphere within the reaction vessel,
wherein said at least one coating nozzle is separated from said at least one film-forming nozzle.

2. The method according to claim 1, wherein
said at least one kind of film-forming gas includes a first film-forming gas and a second film-forming gas;
said at least one kind of coating gas includes a first coating gas and a second coating gas;
the first film-forming gas is the same as the first coating gas; and
a coating nozzle for supplying the first coating gas is separated from a film-forming nozzle for supplying the first film-forming gas.

3. The method according to claim 2, wherein
the second film-forming gas is a metal-containing gas,
the second coating gas is a metal-containing gas, and
both the first film-forming gas and the first coating gas are ozone gas.

4. The method according to claim 2, wherein
the reaction vessel has an exhaust port for evacuating an interior of the reaction vessel;
the film-forming nozzle for supplying the first film-forming gas is a distributing nozzle having a plurality of nozzle holes for discharging the first film-forming gas toward the plurality of semiconductor substrates from their sides; and
the coating nozzle for supplying the first coating gas has a nozzle hole which opens in the reaction vessel at a position farther from the exhaust port than a region in which the plurality of substrates are disposed.

5. The method according to claim 4, wherein
the second film-forming gas is a metal-containing gas,
the second coating gas is a metal-containing gas, and
both the first film-forming gas and the first coating gas are ozone gas.

6. The method according to claim 2, wherein
said at least one kind of film-forming gas includes a third film-forming gas, and
the third film-forming gas is the same as the second coating gas.

7. A method of operating a semiconductor manufacturing system comprising:
providing a reaction vessel having an exhaust port for evacuating an interior of the reaction vessel;
placing substrates in the reaction vessel with the substrates being arrayed in a vertical row within a substrate placing region in the reaction vessel;
thereafter, supplying ozone gas through a first film-forming nozzle and a first metal-containing gas through a second film-forming nozzle into the reaction vessel, thereby forming a deposition film on each of the substrates by repeating atomic or molecular layer deposition, wherein the first film-forming nozzle is a distributing nozzle having a plurality of nozzle holes, for discharging the ozone gas toward the substrates, arrayed vertically beside the substrate placing region;
thereafter, removing the substrates from the reaction vessel;
thereafter, placing a dummy substrate, or no substrate, in the substrate placing region of the reaction vessel; and
thereafter, supplying ozone gas through a first coating nozzle and a second metal-containing gas through a second coating nozzle into the reaction vessel while the dummy or no substrate is therein, thereby forming, by repeating atomic or molecular layer deposition, a coating film over the deposition film formed due to the atomic or molecular layer deposition on a component of said semiconductor manufacturing system exposed to an atmosphere within the reaction vessel, wherein the first coating nozzle has a nozzle hole which opens in the reaction vessel at a position below the substrate placing region so that the ozone gas flows upwardly through the substrate placing region and then flows toward the exhaust port.

8. The method according to claim 7, wherein the deposition film comprises hafnium oxide and the coating film comprises aluminum oxide.

\* \* \* \* \*